(12) United States Patent
Takatoku

(10) Patent No.: US 6,599,783 B2
(45) Date of Patent: Jul. 29, 2003

(54) METHOD OF FABRICATING A THIN FILM INCLUDING A PROTECTIVE LAYER AS A MASK

(75) Inventor: Makoto Takatoku, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/865,104

(22) Filed: May 24, 2001

(65) Prior Publication Data

US 2002/0066902 A1 Jun. 6, 2002

(30) Foreign Application Priority Data

May 25, 2000 (JP) ..................... P2000-154049

(51) Int. Cl.[7] ............ H01L 21/339; H01L 21/00; H01L 21/84; H01L 29/76
(52) U.S. Cl. ..................... 438/148; 438/166
(58) Field of Search ............... 438/148, 166; 257/66

(56) References Cited

U.S. PATENT DOCUMENTS 6,392,720 B1 * 5/2002 Kim ............... 349/42
6,420,246 B1 * 7/2002 Yamazaki et al. .......... 438/476

* cited by examiner

Primary Examiner—Olik Chaudhuri
Assistant Examiner—William M. Brewster
(74) Attorney, Agent, or Firm—Sonnenschein, Nath & Rosenthal

(57) ABSTRACT

A thin film transistor has a laminated structure comprising a semiconductor thin film, a gate insulator formed in contact with the surface of the semiconductor thin film, and a gate electrode disposed on the face side of the semiconductor thin film, and is formed on a substrate in a predetermined plan view shape. To fabricate the thin film transistor, first, a first step is carried out in which a semiconductor thin film having a clean surface is formed over the substrate. Next, a second step is carried out in which a protective film PF is formed so as to cover the clean surface of the semiconductor thin film. Further, in a third step, the semiconductor thin film is patterned together with the protective film PF according to the predetermined plan view shape of the thin film transistor. Thereafter, a fourth step is carried out in which the protective film PF is removed from the upper side of the patterned semiconductor thin film to expose a clean surface. Subsequently, a fifth step is carried out in which a gate insulator is formed in contact with the exposed surface of the semiconductor thin film.

20 Claims, 7 Drawing Sheets

F I G. 5A
F I G. 5B
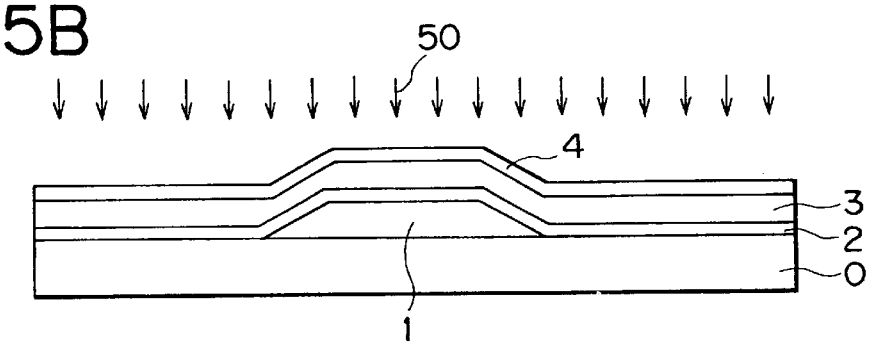
F I G. 5C
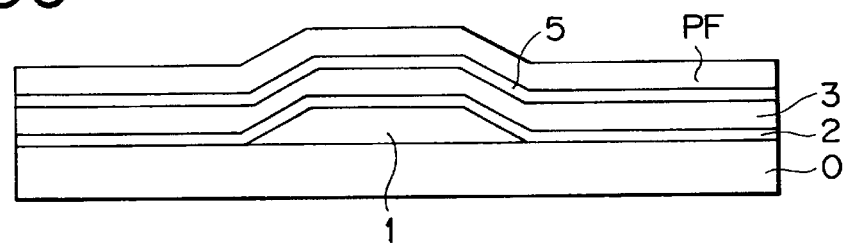
F I G. 5D
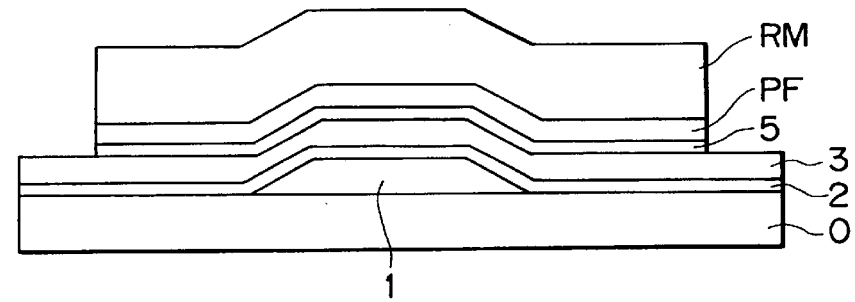
F I G. 5E
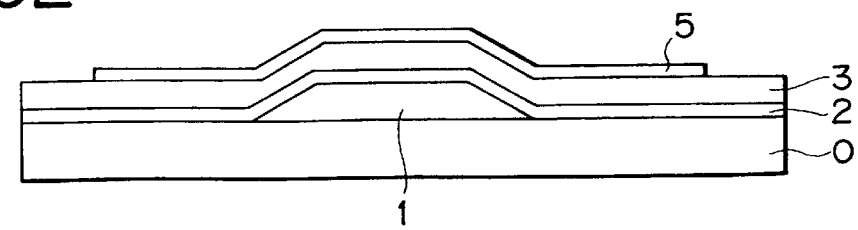

F I G. 7
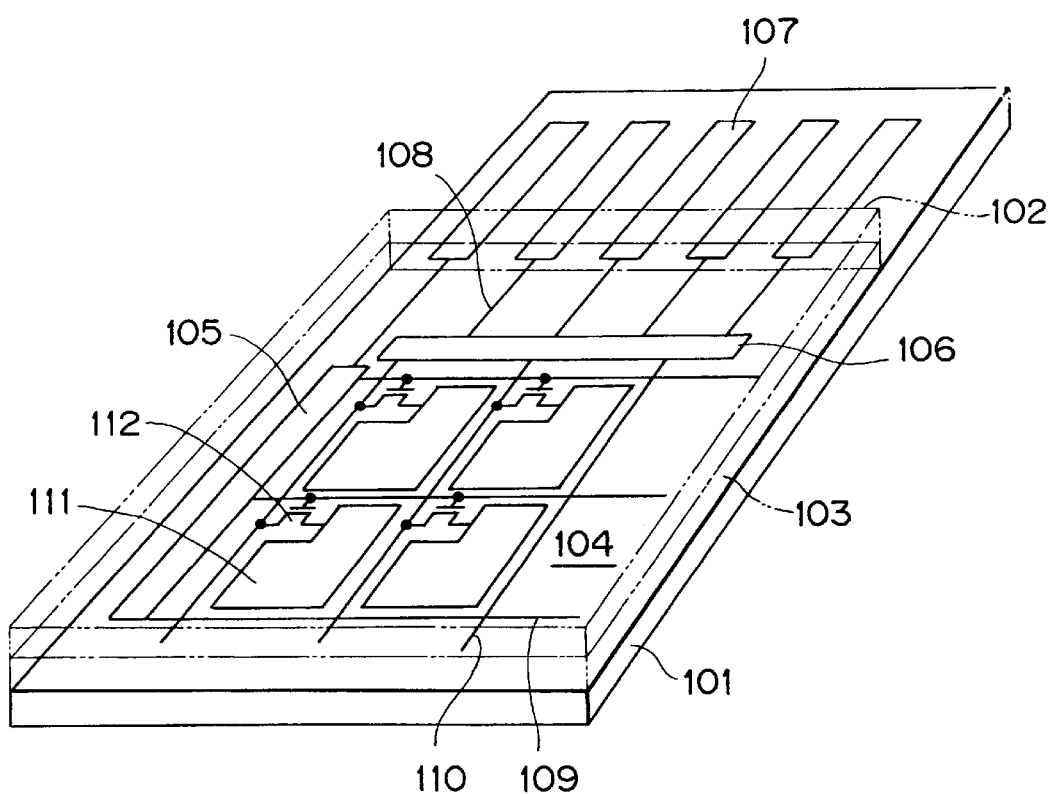

METHOD OF FABRICATING A THIN FILM INCLUDING A PROTECTIVE LAYER AS A MASK

The present application claims priority to Japanese Application No. P2000-154049 filed May 25, 2000 which application is incorporated herein by reference to the extent permitted by law

BACKGROUND OF THE INVENTION

The present invention relates to a method of fabricating a thin film transistor. More particularly, the invention relates to a technology for keeping clean the condition of an interface between a semiconductor thin film and an insulating film formed on the surface of the semiconductor thin film.

In recent years, thin film transistors have been extensively developed as active devices in active matrix circuits integratedly formed on an insulating substrate. The thin film transistor, for example, has a semiconductor thin film of polycrystalline silicon as a device region. In order to isolate individual thin film transistors, a semiconductor thin film of polycrystalline silicon or the like must be patterned in island forms by photolithographic technology.

However, there has been the problem that when polycrystalline silicon is directly patterned, deposition of a large amount of impurities uncontrollable in photolithographic step occurs, and the impurities would diffuse into semiconductor thin film or an insulating film in contact therewith in latter steps or would segregate to the surface of the semiconductor thin film. In such a situation, it is difficult to control the characteristics of the thin film transistor.

Countermeasure against the above problem is disclosed, for example, in Japanese Patent Laid-open No. Hei 10-116989. According to the disclosure, a first gate insulator is first formed on the surface of a semiconductor thin film consisting of polycrystalline silicon. Subsequently, the surface of the semiconductor thin film of polycrystalline silicon is patterned through the first gate insulator without exposing the surface to a photoresist treatment. Thereafter, only the surface of the first gate insulator is partly removed by etching. Further, a second gate insulator is formed on the first gate insulator. According to the prior art, however, although the layer of polycrystalline silicon is not exposed to the atmosphere and is kept clean, a contaminated interface is generated between the first gate insulator and the second gate insulator. With electric charges trapped at the contaminated interface, there may arise the problem that the characteristics of the thin film transistor cannot be controlled.

SUMMARY OF THE INVENTION

It is an object of the present invention to provide a technology of fabrication of a thin film transistor by which a semiconductor thin film constituting a device region of the thin film transistor can be patterned in island forms while keeping a clean surface condition. In order to attain the above object, the following means have been adopted. Namely, the present invention resides in a method of fabricating a thin film transistor having a laminated structure including a semiconductor thin film, an insulating film formed in contact with the surface of the semiconductor thin film, and a gate electrode disposed on the face side or the back side of the semiconductor thin film, and formed on a substrate in a predetermined plan view shape, the method including: a first step of forming a semiconductor thin film having a clean surface over the substrate; a second step of forming a protective film so as to cover the clean surface of the semiconductor thin film; a third step of patterning the semiconductor thin film together with the protective film according to the plan view shape of the thin film transistor; a fourth step of removing the protective film from the upper side of the patterned semiconductor thin film to expose a clean surface of the semiconductor thin film; and a fifth step of forming an insulating film in contact with the exposed surface of the semiconductor thin film.

Preferably, the first step includes forming a semiconductor thin film consisting of silicon being amorphous or being polycrystalline with a comparatively small grain size, followed by irradiation with laser light to convert the amorphous or polycrystalline silicon to polycrystalline silicon having a comparatively large grain size. The first step may comprise forming a semiconductor thin film consisting of silicon being amorphous or being polycrystalline with a comparatively small grain size, followed by a heat treatment to obtain polycrystalline silicon having a comparatively large grain size through solid phase growth. Besides, the second step may include forming a protective film consisting of an insulating substance. In this case, the second step may comprise thermally oxidizing the surface of the semiconductor thin film consisting of silicon to form a protective film consisting of silicon oxide. The second step may comprise forming a protective film by building up silicon oxide through chemical vapor deposition. Alternatively, the second step may comprise forming the protective film by building up a semiconductor substance. Preferably, the second step comprises forming a protective film having a thickness of not less than 5 nm. The fourth step may comprise removing the protective film by wet etching in which a chemical having a dissolving function is made to act in a flowing manner without circulatorily using the chemical. Preferably, the method comprises a sixth step of forming a gate electrode on the insulating film formed in contact with the clean surface of the semiconductor thin film.

According to the present invention, a protective film being, for example, insulating is formed on a semiconductor thin film consisting of polycrystalline silicon or the like. The semiconductor thin film is patterned together with the protective film by photolithography, whereby the surface of the semiconductor thin film is protected from contamination in the photolithographic step. Therefore, it is possible to keep clean the interface between the semiconductor thin film and the gate insulator formed on the surface of the semiconductor thin film.

According to the present invention, since the interface between the semiconductor thin film consisting of polycrystalline silicon or the like and the gate insulator can be kept clean, diffusion of impurities in a channel is suppressed, whereby mobility of the thin film transistor is largely improved. In addition, the amount of impurities in the gate insulator in contact with the semiconductor thin film or in an interlayer dielectric is reduced, whereby threshold voltage of the thin film transistor can be stabilized.

BRIEF DESCRIPTION OF THE DRAWINGS

FIG. 5 is a process chart showing another example of the method of fabricating a thin film transistor according to the invention;

FIG. 7 is a schematic perspective view showing an example of a liquid crystal display device according to the invention.

DETAILED DESCRIPTION OF THE PREFERRED EMBODIMENTS

Hereinafter, a preferred embodiment of the present invention will be described in detail with reference to the accompanying drawings.

FIG. 1 is a process chart showing one example of a first embodiment of the method of fabricating a thin film transistor according to the present invention. The present invention can be applied to both a low temperature process with a highest treatment temperature of less than 600 and a high temperature process with a highest treatment temperature of 700 to 1200, in the method of fabricating a thin film transistor. Besides, as to the form of the thin film transistor, the present invention can be applied to both a top gate structure and a bottom gate structure. In this embodiment, particularly, a method of fabricating a thin film transistor of the top gate structure by the low temperature process will be shown.

Figure 1A:
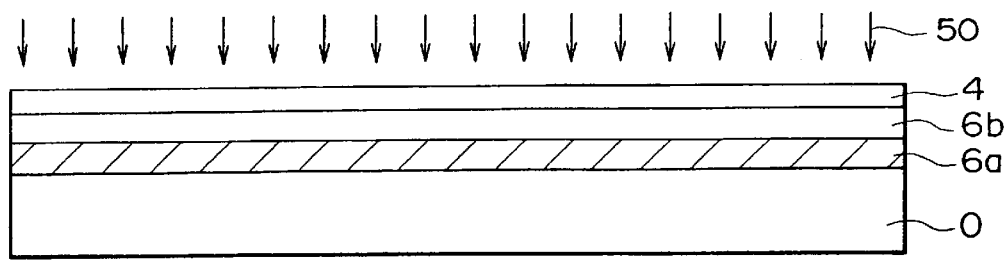
FIG. 1 is a process chart showing a method of fabricating a thin film transistor according to the invention.

First, as shown in FIG. 1A, a silicon oxide film 6a and a silicon nitride film 6b are built up on an insulating substrate 0 consisting of a glass or the like by using, for example, plasma CVD. These insulating films are provided for preventing diffusion of impurities from the substrate 0. Further, a semiconductor thin film 4 to be a device region (active layer) of a thin film transistor (TFT) is built up on the silicon nitride film 6b by, for example, plasma CVD. In this embodiment, the semiconductor thin film 4 is amorphous silicon or polycrystalline silicon with a comparatively small crystal grain size. Thereafter, the semiconductor thin film 4 is irradiated with laser light 50 emitted from, for example, an excimer laser light source, whereby the amorphous silicon or polycrystalline silicon with a comparatively small crystal grain size is converted to polycrystalline silicon with a comparatively large crystal grain size. In some cases, the crystallizing annealing by use of laser light may be replaced by a melting crystallizing technique. Namely, after the semiconductor thin film consisting of amorphous silicon or polycrystalline silicon with a comparatively small grain size is formed, a heating treatment by use of a furnace is carried out to obtain polycrystalline silicon with a comparatively large grain size through solid phase growth.

Figure 1B:
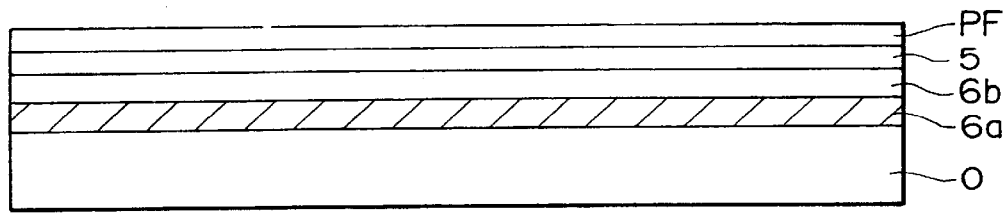

Next, as shown in FIG. 1B, a protective film PF is provided so as to cover a clean surface of the crystallized semiconductor thin film 5. In this embodiment, a silicon oxide film is built up to a thickness of about 10 nm by use of plasma CVD, for example. Therefore, an insulating protective film PF is provided. In some cases, instead of using the CVD (Chemical Vapor Deposition), the surface of the semiconductor thin film 5 consisting of polycrystalline silicon may be thermally oxidized to obtain a protective film PF consisting of silicon oxide. Alternatively, a semiconductor substance such as silicon may be built up to form the protective film PF. In order to keep the cleanliness of the surface of the semiconductor thin film 5, the protective film PF is preferably formed to have a thickness of at least 5 nm.

Figure 1C:
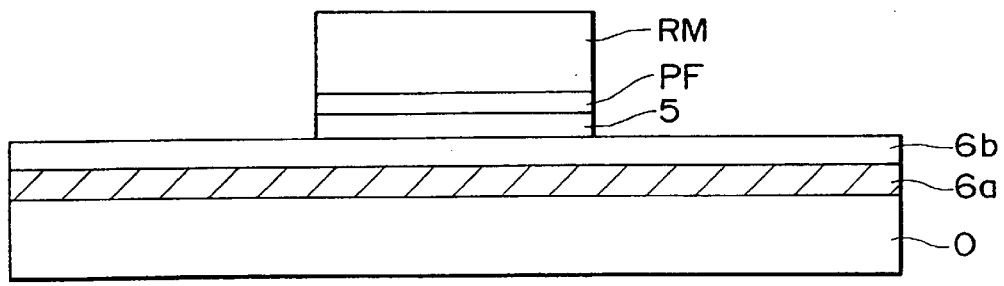

Subsequently, as shown in FIG. 1C, the semiconductor thin film 5 is patterned together with the protective film PF into an island form, according to the plan view shape of the thin film transistor. Specifically, a photoresist RM is applied to the protective film PF formed over the substrate 0, and is patterned into a predetermined plan view shape by exposure to light and development. By using the thus patterned photoresist RM as a mask, the semiconductor thin film 5 and the protective film PF are simultaneously patterned by etching. The etching may be either dry etching or wet etching.

Figure 1D:
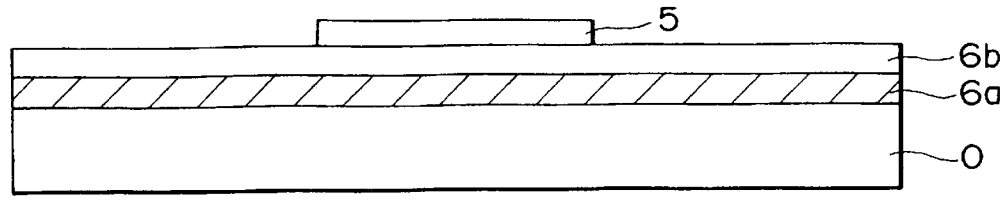

Thereafter, as shown in FIG. 1D, the photoresist RM thus used is removed by ashing or by use of a chemical liquid. Then, the protective film PF contaminated in the etching step is removed from the upper side of the patterned semiconductor thin film 5, to expose a clean surface. In this case, in order not to damage the polycrystalline silicon, it is preferable to use a wet treatment with an HF-containing chemical liquid. Besides, in order to keep the cleanliness of the chemical liquid itself, the chemical liquid is disposed without being circulatorily used in chemical liquid treating equipment, after once making contact with the substrate 0. In addition, in order to obviate the situation where impurities turn round from the substrate within a chemical liquid reservoir, it is preferable to pour the chemical liquid from above the substrate 0, instead of immersing the substrate in a chemical liquid reservoir. Namely, the protective film PF is removed by wet etching in which the chemical having a dissolving function is made to act in a flowing manner without circulatorily using the chemical.

Figure 2A:
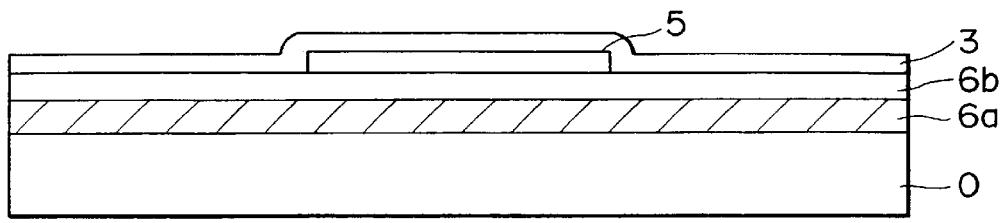
FIG. 2 is also a process chart.

Subsequently, as shown in FIG. 2A, a gate insulator 3 is formed in contact with the exposed surface of the semiconductor thin film 5. For example, $SiO_2$ is grown in a thickness of 50 to 400 nm by plasma CVD method, normal pressure CVD method, reduced pressure CVD method, ECR-CVD method, sputtering method or the like, to provide the gate insulator 3. In this example, the film thickness of the gate insulator 3 is 100 nm. If necessary, ion implantation for adjustment of threshold voltage (Vth) is carried out to inject B+ ion into the semiconductor thin film 5 in a dose of about $0.5 \times 10^{12}$ to $4 \times 10^{12}/cm^2$. In this case, the acceleration voltage is about 50 KeV. The Vth ion implantation may be carried out before the formation of the gate insulator 3.

Figure 2B:
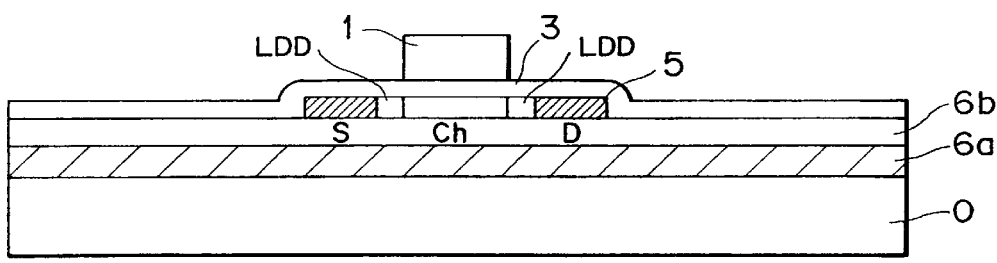

Subsequently, as shown in FIG. 2B, a gate electrode 1 is formed on the gate insulator 3. For example, Al, Ti, Mo, W, Ta, doped polycrystalline silicon or the like or an alloy of these substances is built up in a thickness of 200 to 800 nm, and is patterned into a predetermined shape to provide the gate electrode 1. Next, P+ ion is injected into the semiconductor thin film 5 by an ion injection method using mass separation, to provide an LDD region. This ion injection is carried out over the entire surface of the insulating substrate 0, with the gate electrode 1 as a mask. The dose is $6 \times 10^{12}$ to $5 \times 10^{13}/cm^2$. The acceleration voltage is 100 KeV, for example. As a doping gas, a mixture gas of $PH_3/H_2$ is used. After the ion injection into the LDD region, a resist pattern is provided so as to cover the gate electrode 1 and the vicinity thereof, and P+ ion is injected in a high concentration by a mass non-separation type ion shower doping method, to provide a source region S and a drain region D. In this case, the dose is about $1 \times 10^{15}/cm^2$, for example. The acceleration voltage is 100 KeV. As a doping gas, a hydrogen-diluted 20% $PH_3$ gas was used. In the case of producing a CMOS circuit, a resist pattern for a p-channel thin film transistor is formed, then the doping gas is changed to a 5 to 20% $B_2H_6/H_2$ gas, and ion is injected in a dose of about $1 \times 10^{15}$ to $3 \times 10^{15}/cm^2$. The acceleration voltage is about 50 KeV. The formation of the source region S and the drain region D may be carried out by use of a mass separation type ion injection apparatus.

Figure 2C:
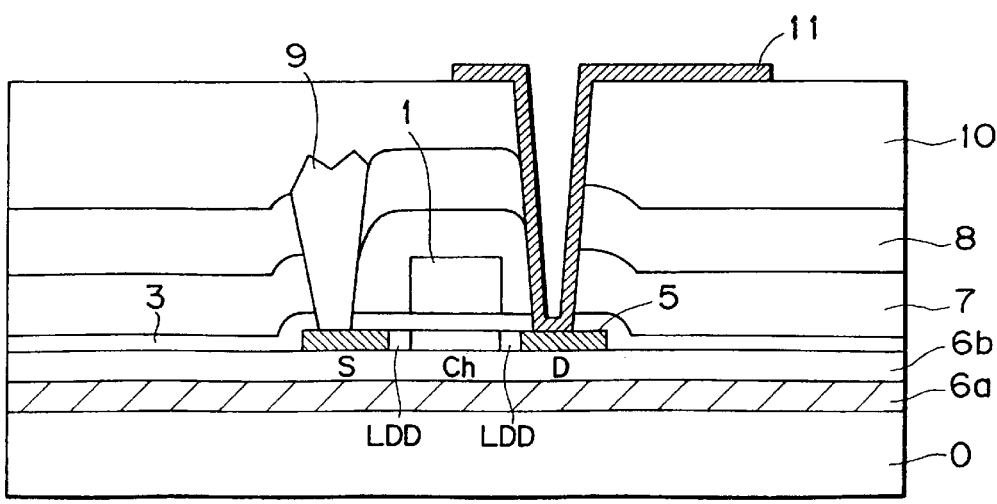

Finally, as shown in FIG. 2C, an interlayer dielectric 7 consisting of $SiO_2$ is formed in a thickness of about 600 nm so as to cover the gate electrode 1. By a plasma CVD method, $SiN_X$ is built up in a thickness of about 200 to 400 nm to form a passivation film (cap film) 8. At this stage, annealing is carried out in a nitrogen gas at a temperature of 350 to 400 for about 1 hour, whereby hydrogen contained in the interlayer dielectric 7 is diffused into the semiconductor thin film 5. Thereafter, a contact hole is opened. Further, a film of Mo, Al or the like is formed on the passivation film 8 by sputtering, and is patterned into a predetermined shape to produce a wiring electrode 9. Further, a flattening layer 10 consisting of an acrylic resin or the like is applied in a thickness of about 1 m, and a contact hole is opened in the flattening layer 10. A transparent conductor film consisting of ITO, IXO or the like is sputtered onto the flattening layer 10, and is patterned in a predetermined shape to produce a pixel electrode 11. In the case of ITO, annealing is carried out in $N_2$ at a temperature of about 220 for about 30 minutes.

Figure 3:
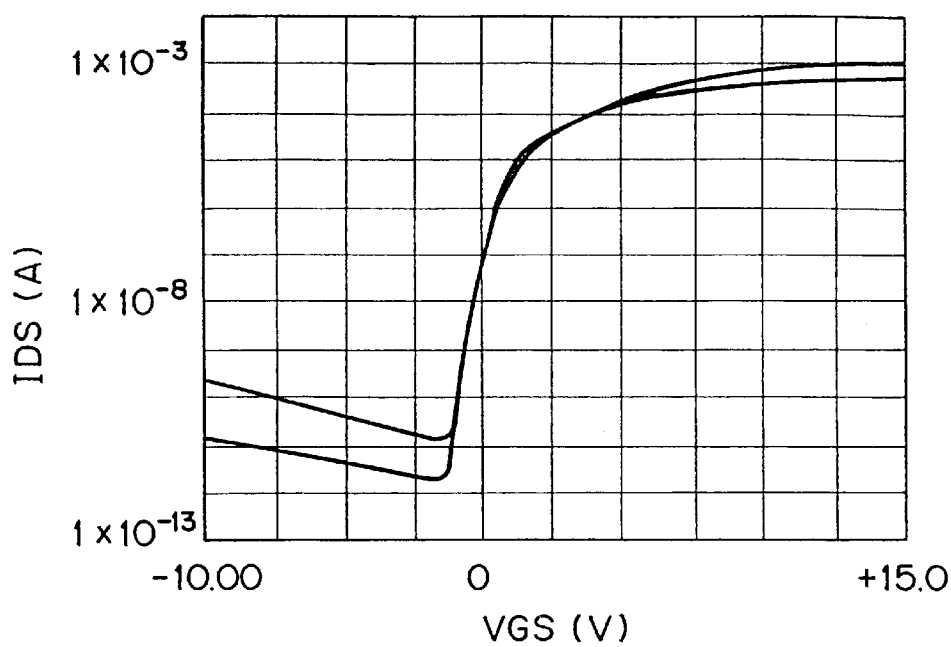
FIG. 3 is a graph showing the characteristics of a thin film transistor fabricated according to the invention.

FIG. 3 is a graph showing the operation characteristics of a thin film transistor fabricated according to the present invention. In the graph, the axis of abscissa is gate voltage VGS, and the axis of ordinate is drain current IDS. The number of samples is two. As apparent from the graph, the drain current IDS rises up steeply as the gate voltage VGS increases, which means good threshold characteristics. According to the present invention, the surface of the semiconductor thin film is kept clean, and the amount of impurities in the gate insulator in contact with the clean surface is reduced, whereby the threshold voltage can be stabilized as shown in the figure. In addition, the interface between the semiconductor thin film and the gate insulator can be clean, and diffusion of impurities in the channel is decreased, whereby mobility of the thin film transistor is largely enhanced. For example, in the case of an N channel type thin film transistor, the mobility is about 150 $cm^2$/V.s. In the case of a P channel type thin film transistor, the mobility is about 100 $cm^2$/V.s.

Figure 4:
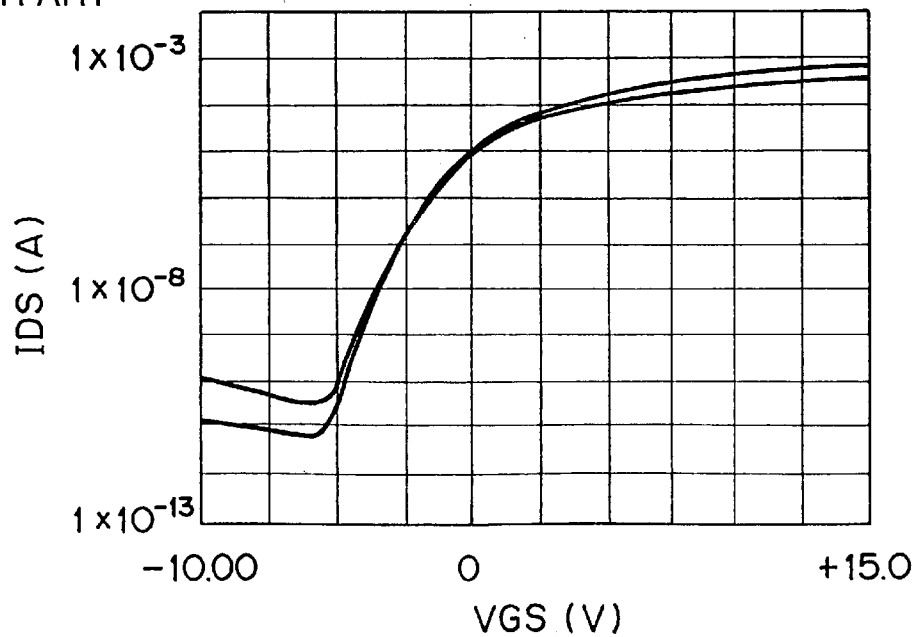
FIG. 4 is a graph showing the characteristics of a thin film transistor according to the prior art.

FIG. 4 is a reference graph showing the characteristics of a thin film transistor fabricated by a method according to the prior art. In the reference example, after a semiconductor thin film is patterned into an island form, a natural oxidized film remaining on the surface is removed by pure water and hydrofluoric acid, and a gate insulator is formed thereon. The thickness of the natural oxidized film is about 1 to 2 nm. Since the cleanliness of the surface cannot be kept by mere removal of the natural oxidized film, the threshold characteristics are not steep, as compared with FIG. 3. In addition, the mobility is about 46 $cm^2$/V.s in the case of N channel type, and is as low as about 28 $cm^2$/V.s in the case of P channel type. Incidentally, the grain size of the polycrystalline silicon constituting the semiconductor thin film is set to be about 250 nm, both in the case of the present invention and in the case of the prior art example.

FIGS. 5A to 5E are process charts showing one example of a second embodiment of the method of fabricating a thin film transistor according to the present invention. This is a method of fabricating a thin film transistor of the bottom gate type which has a laminated structure comprising a semiconductor thin film, an interlayer dielectric formed in contact with the surface of the semiconductor thin film, and a gate electrode disposed on the back side of the semiconductor thin film, and which is formed on a substrate in a predetermined plan view shape. In this embodiment, for convenience, a method of fabricating a thin film transistor of the N channel type is shown, but the same applies to the case of the P channel type by merely changing the kind of impurities. First, as shown in FIG. 5A, a film of Al, Ta, Mo, W, Cr, Cu, or an alloy of these elements is formed in a thickness of 100 to 250 nm on an insulating substrate 0 consisting of a glass or the like, and is patterned to provide a gate electrode 1.

Next, as shown in FIG. 5B, a gate insulator is formed on the gate electrode 1. In this embodiment, as the gate insulator, a double-layer structure of a gate nitride film 2 ($SiN_X$) and a gate oxide film 3 ($SiO_2$) was used. The gate nitride film 2 was built up by a plasma CVD method (PCVD method) using a mixture of $SiH_4$ gas and $NH_3$ gas as a raw material gas. Incidentally, the plasma CVD may be replaced by normal pressure CVD or reduced pressure CVD. In this embodiment, the gate nitride film 2 was built up in a thickness of 50 nm. Continuously to the formation of the gate nitride film 2, the gate oxide film 3 is formed in a thickness of about 200 nm. Continuously, a semiconductor thin film 4 consisting of amorphous silicon was formed in a thickness of about 30 to 80 nm on the gate oxide film 3. The film formation of the double-layer gate insulator and the film formation of the amorphous semiconductor thin film 4 was carried out continuously, without breaking the vacuum in a film-forming chamber. In the case where plasma CVD is used in the film formations, so-called dehydrogenation annealing is carried out in which a heat treatment at a temperature of 400 to 450 is carried out in a nitrogen atmosphere for about 1 to 2 hours, to discharge hydrogen contained in the amorphous semiconductor thin film 4.

Here, as required, Vth ion implantation is carried out in order to control the Vth of the thin film transistor. In this example, B+ ion was injected in a dose of about $1\times10^{12}$ to $6\times10^{12}/cm^2$. In the Vth ion implantation, a line beam of ion shaped to a 620 nm width was used. An injection method using a line beam of ion previously subjected to mass separation is a favorable method for uniformly introducing an impurity ion into a semiconductor thin film formed on a large glass substrate. Next, irradiation with laser light 50 is carried out to crystallize the amorphous semiconductor thin film 4. As the laser light 50, an excimer laser beam can be used. So-called laser annealing is a potent means for crystallizing a semiconductor thin film at a process temperature of not higher than 600. In this embodiment, the crystallization is carried out by irradiating the amorphous semiconductor thin film 4 with laser light 50 excited in a pulse form and shaped in a rectangular or belt-like shape. In some cases, crystallization of the semiconductor thin film may be carried out by a solid phase growth method.

Subsequently, as shown in FIG. 5C, a protective film PF is formed so as to cover the clean surface of the polycrystalline semiconductor thin film 5. For example, silicon oxide is built up by chemical vapor deposition to provide the protective film PF.

Subsequently, as sown in FIG. 5D, a photoresist RM is applied to the protective film PF. The photoresist is subjected to exposure to light and development, and is patterned in an island form according to the shape of the device region of thin film transistor. With the patterned photoresist RM as a mask, the protective film PF and the polycrystalline semiconductor thin film 5 are together patterned by dry etching or wet etching. Since the surface of the semiconductor thin film 5 is covered by the protective film PF, the surface would not be contaminated in the etching step.

Next, as shown in FIG. 5E, the photoresist RM thus used is removed by an ashing treatment. Further, the protective film PF used is removed to expose the clean surface of the polycrystalline semiconductor thin film 5. In this case, the protective film PF is removed by wet etching in which a chemical having a dissolving function is made to act in a flowing manner without circulatorily using the chemical, to ensure that the surface of the polycrystalline semiconductor thin film 5 is not contaminated.

Figure 6A:
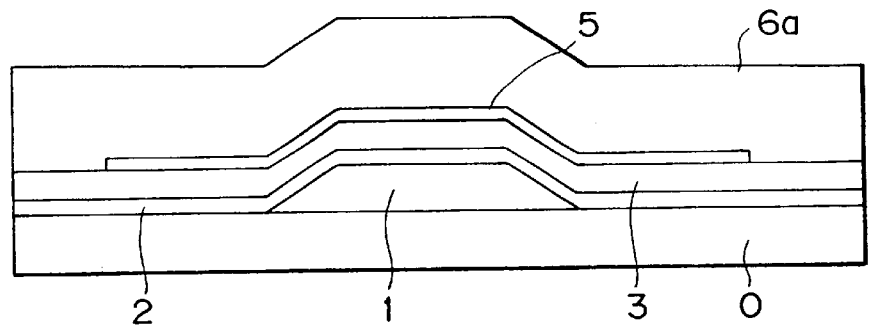
FIG. 6 is also a process chart.

Subsequently, as shown in FIG. 6A, an insulating film 6a is formed in contact with the exposed surface of the semiconductor thin film 5. Here, $SiO_2$ was built up in a thickness of about 100 to 300 nm by a plasma CVD method. In this example, $SiO_2$ was formed by decomposition of silane gas.

Figure 6B:
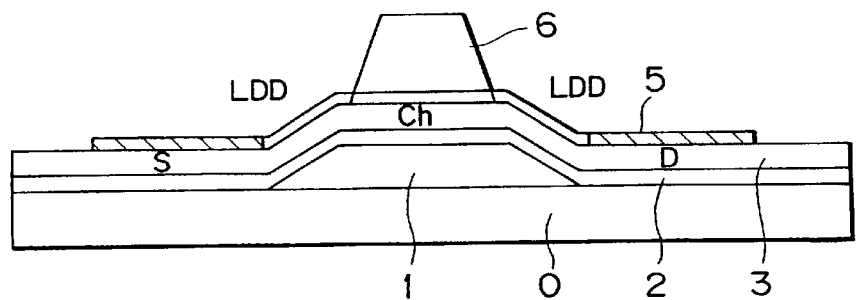

Subsequently, as shown in FIG. 6B, the insulating film 6a consisting of $SiO_2$ is patterned to provide a stopper film 6. In this case, a back side exposure technique is used so that the stopper film 6 is patterned in match with the gate electrode 1. A clean portion of the polycrystalline semiconductor thin film 5 located beneath the stopper film 6 is protected as a channel region Ch. Then, with the stopper film 6 as a mask, ion implantation is carried out to inject an impurity (for example, P+ ion) into the semiconductor thin film 5, thereby forming LDD regions. At this time, the dose is $4 \times 10^{12}$ to $5 \times 10^{13}/cm^2$, for example. The acceleration voltage is, for example, 10 KeV. Further, a photoresist is applied and patterned so as to cover the stopper film 6 and the LDD regions on both side thereof, and, with the patterned photoresist as a mask, an impurity (for example, P+ ion) is injected in a high concentration to form a source region S and a drain region D. For the injection of impurity, for example, ion doping (ion shower) can be used. This is a technique of injecting an impurity by acceleration by electric field without conducting mass separation. In this example, impurity was injected in a dose of about $1 \times 10^{15}/cm^2$ by using $PH_3$ gas diluted with $H_2$, to form the source region S and the drain region D. Though not shown, in the case of fabricating a p-channel thin film transistor, the region of the n-channel thin film transistor is covered by a photoresist, then the impurity is changed from P+ ion to B+ ion, and ion doping is carried out in a dose of about $1 \times 10^{15}/cm^2$. For example, $B_2H_6$ gas diluted with $H_2$ is used. Here, the injection of impurity may be carried out by using a mass separation type ion implantation apparatus.

Figure 6C:
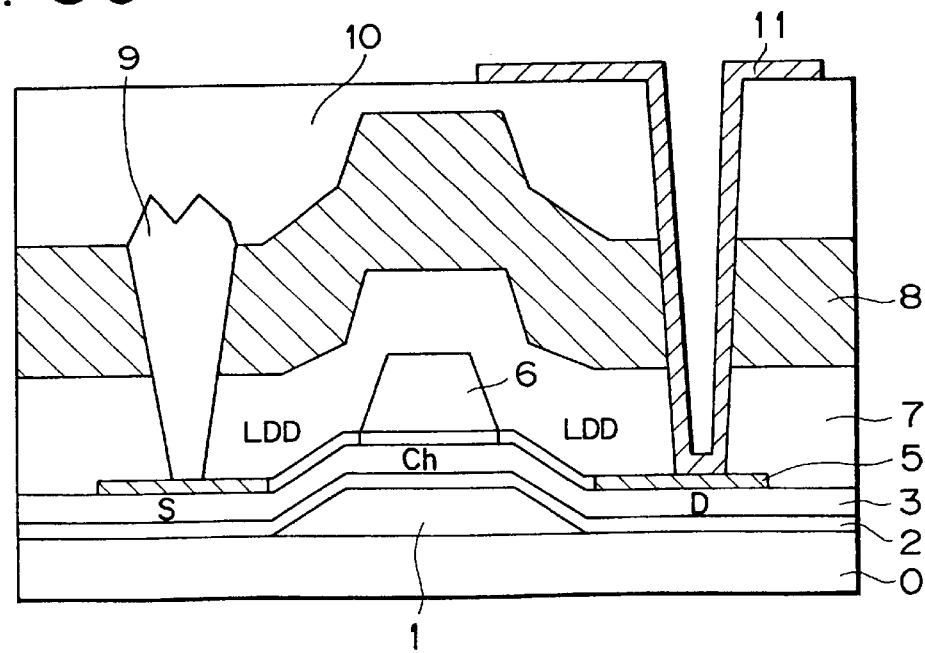

Finally, as shown in FIG. 6C, a film of $SiO_2$ is formed in a thickness of about 200 nm to provide an interlayer dielectric 7. After the formation of the interlayer dielectric 7, a film of $SiN_X$ is formed in a thickness of about 200 to 400 nm by a plasma CVD method to provide a passivation film (cap film) 8. At this stage, a heat treatment at about 350 is carried out in a nitrogen gas or forming gas atmosphere or in vacuum for 1 hour, whereby hydrogen atoms contained in the interlayer dielectric 7 are diffused into the semiconductor thin film 5. Thereafter, a contact hole is opened, then Mo, Al or the like is sputtered in a thickness of 200 to 400 nm, and is patterned in a predetermined shape to provide a wiring electrode 9. Further, a flattening layer 10 consisting of an acrylic resin or the like is applied in a thickness of about 1 m, and a contact hole is opened. A transparent conductor film consisting of ITO, IXO or the like is sputtered onto the flattening layer 10, and is patterned in a predetermined shape to provide a pixel electrode 11. In the case where ITO is used, annealing is carried out at 220 in $N_2$ for about 30 minutes.

Referring now to FIG. 7, an example of a liquid crystal display device using a thin film transistor fabricated according to the present invention will be described. As shown, this display device has a panel structure comprising a pair of insulating substrates 101 and 102 and an electro-optical substance 103 held therebetween. As the electro-optical substance 103, for example, a liquid crystal material is used.

A pixel array portion 104 and a driving circuit portion are integratedly formed on the lower insulating substrate 101. The driving circuit portion is divided into a vertical driving circuit 105 and a horizontal driving circuit 106. A terminal portion 107 for external connection is provided at top end of a peripheral portion of the insulating substrate 101. The terminal portion 107 is connected to the vertical driving circuit 105 and the horizontal driving circuit 106 through a wiring 108. The pixel array portion 104 comprises gate wirings 109 in a row form and signal wirings 110 in a column form. At each of intersections of both wirings, a pixel electrode 111 and a thin film transistor 112 for driving the pixel electrode 111 are provided. A gate electrode of the thin film transistor 112 is connected to a corresponding gate wiring 109, a drain region is connected to a corresponding pixel electrode 111, and a source region is connected to a corresponding signal wiring 110. The gate wiring 109 is connected to the vertical driving circuit 105, whereas the signal wiring 110 is connected to the horizontal driving circuit 106. The thin film transistor 112 for switching and driving the pixel electrode 111 and thin film transistors contained in the vertical driving circuit 105 and the horizontal driving circuit 106 are fabricated according to the present invention.

Figure 8:
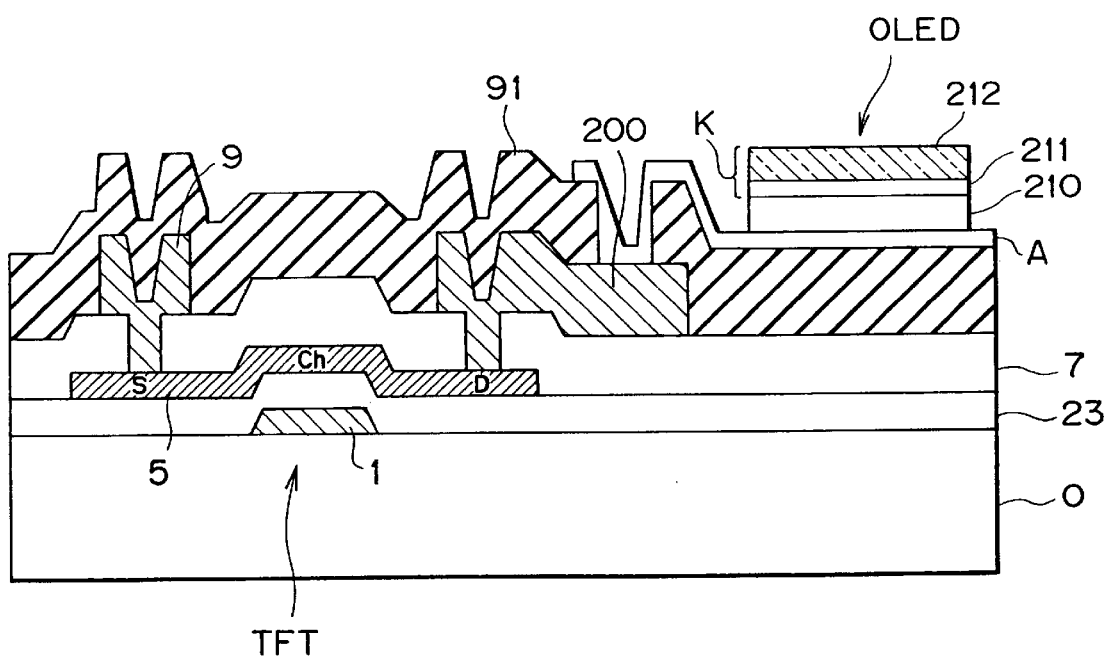
FIG. 8 is a schematic sectional view showing an example of an electroluminescence display device according to the invention.

FIG. 8 is a schematic partly sectional view showing another embodiment of the display apparatus according to the present invention. In this embodiment, an organic electroluminescence device OLED is used as a pixel. The OLED comprises an anode A, an organic layer 210 and a cathode K laminated in this order. The anode A is separated for every pixel, consists of, for example, chromium and is basically light-reflective. The cathode K is connected in common to individual pixels, has a laminated structure of, for example, an extremely thin metallic layer 211 and a transparent conductor layer 212, and is basically light-transmissive. When a forward voltage (about 10 V) is impressed between the anode A and the cathode K of the OLED having such a structure, injection of carrier such as electrons and positive holes occurs, and light emission is observed. The operation of the OLED is considered to be light emission by excitons produced by the positive holes injected from the anode A and electrons injected from the cathode K.

On the other hand, the thin film transistor TFT for driving the OLED comprises a gate electrode 1 formed on a substrate 0 consisting of a glass or the like, a gate insulator 23 laminated thereon, and a semiconductor thin film 5 laminated on the upper side of the gate electrode 1 through the gate insulator 23. The semiconductor thin film 5 consists, for example, of a silicon thin film made to be polycrystalline by laser annealing. The thin film transistor TFT comprises a source region S, a channel region Ch and a drain region D providing a path of electric current supplied to the OLED. The channel region Ch is located directly above the gate electrode 1. The thin film transistor TFT having the bottom gate structure is covered by an interlayer dielectric 7, and a signal wiring 9 and a drain electrode 200 are formed thereon. On these components, the above-mentioned OLED is provided in a film form through another interlayer dielectric 91. The anode A of the OLED is electrically connected to the thin film transistor TFT through the drain electrode 200.

While the preferred embodiment of the present invention has been described using the specific terms, such description is for illustrative purposes only, and it is to be understood that changes and variations may be made without departing from the spirit or scope of the following claims.

FIGS. 1A, 2A

0: Insulating substrate

FIG. 5A
0: Insulating substrate
1: Gate electrode
50: Laser light
FIG. 5B
2: Gate nitride film
3: Gate oxide film
4: Amorphous semiconductor thin film
FIG. 5C
PF protective film
5: Polycrystalline semiconductor thin film
FIG. 6B
6: Stopper film
FIG. 6C
9: Wiring electrode
10: Flattening layer
11: Pixel electrode
FIG. 8
0: Glass substrate
1: Gate electrode
5: Semiconductor thin film
7: Interlayer dielectric
9: Signal wiring
23: Gate insulator
91: Interlayer dielectric
200: Drain electrode
210: Organic layer
211: Metallic layer
212: Transparent conductor layer
A: Anode
K: Cathode

What is claimed is:

1. A method of producing a liquid crystal display device comprising a pair of substrates jointed to each other with a gap therebetween, a liquid crystal disposed in said gap, pixel electrodes and thin film transistors for driving said pixel electrodes provided on one of said substrates, wherein said thin film transistor has a laminated structure comprising a semiconductor thin film, an insulating film provided in contact with the surface of said semiconductor thin film, and a gate electrode disposed on the face side or the back side of said semiconductor thin film, and said thin film transistor is formed on one of said substrates in a predetermined plan view shape by:
a first step for forming a semiconductor thin film having a clean surface over a substrate,
a second step of forming a protective film so as to cover said clean surface of said semiconductor thin film,
a third step of patterning said semiconductor thin film together with said protective film according to said plan view shape of said thin film transistor, said step of patterning including forming a photoresist over said protective film and etching same,
a fourth step of removing said protective film from the upper side of said patterned semiconductor thin film to expose said clean surface, and
a fifth step of forming an insulating film in contact with said exposed surface of said semiconductor thin film.

2. A method of producing a liquid crystal display device according to claim 1, wherein said first step comprises forming a semiconductor thin film consisting of silicon being amorphous or being polycrystalline with a comparatively small grain size, followed by irradiation with laser light to convert said amorphous or polycrystalline silicon to polycrystalline silicon having a comparatively large grain size.

3. A method of producing a liquid crystal display device according to claim 1, wherein said first step comprises forming a semiconductor thin film consisting of silicon being amorphous or being polycrystalline with a comparatively small grain size, followed by a heat treatment to obtain polycrystalline silicon having a comparatively large grain size through solid phase growth.

4. A method of producing a liquid crystal display device according to claim 1, wherein said second step comprises forming a protective film consisting of an insulating substance.

5. A method of producing a liquid crystal display device according to claim 4, wherein said second step comprises thermally oxidizing the surface of a semiconductor thin film consisting of silicon to form a protective film consisting of silicon oxide.

6. A method of producing a liquid crystal display device according to claim 4, wherein said second step comprises forming a protective film by building up silicon oxide through chemical vapor deposition.

7. A method of producing a liquid crystal display device according to claim 1, wherein said second step comprises forming said protective film by building up a semiconductor substance.

8. A method of producing a liquid crystal display device according to claim 1, wherein said second step comprises forming a protective film having a thickness of not less than 5 nm.

9. A method of producing a liquid crystal display device according to claim 1, wherein said fourth step comprises removing said protective film by wet etching in which a chemical having a dissolving function is made to act in a flowing manner without circulatorily using said chemical.

10. A method of producing a liquid crystal display device according to claim 1, further comprising a sixth step of forming a gate electrode on said insulating film formed in contact with the clean surface of said semiconductor thin film.

11. A liquid crystal display device comprising a pair of substrates jointed to each other with a gap therebetween, a liquid crystal disposed in said gap, pixel electrodes and thin film transistors for driving said pixel electrodes provided on one or said substrates, and a counter electrode provided on the other of said substrates, wherein said thin film transistor has a laminated structure comprising a semiconductor thin film, an insulating film formed in contact with the surface of said semiconductor thin film, and a gate electrode disposed on the face side or the back side of said semiconductor thin film, and is formed on one of said substrates in a predetermined plan view shape, said semiconductor thin film is provided by forming a semiconductor thin film over said substrate in the state of having a clean surface, thereafter forming a protective film so as to cover said clean surface, then pattering said semiconductor thin film together with said protective film according to said predetermined plan view shape, and removing said protective film to expose said clean surface, said patterning including forming a photoresist over said protective film and etching same, and said insulating film is formed in contact with said exposed surface of said semiconductor thin film.

12. A liquid crystal display device according to claim 11, wherein said semiconductor thin film is provided by forming a semiconductor thin film consisting of silicon being amorphous or being polycrystalline with a comparatively small grain size, followed by irradiation with laser light to convert said amorphous or polycrystalline silicon to polycrystalline silicon having a comparatively large grain size.

13. A liquid crystal display device according to claim 11, wherein said semiconductor thin film is provided by forming a semiconductor thin film consisting of silicon being amorphous or being polycrystalline with a comparatively small grain size, followed by a heat treatment to obtain polycrystalline silicon having a comparatively large grain size through solid phase growth.

14. A liquid crystal display device according to claim 11, wherein said protective film consists of an insulating substance.

15. A liquid crystal display device according to claim 14, wherein said insulating substance is silicon oxide obtained by thermally oxidizing the surface of a semiconductor thin film consisting of silicon.

16. A liquid crystal display device according to claim 14, wherein said insulating substance is silicon oxide built up by chemical vapor deposition.

17. A liquid crystal display device according to claim 11, wherein said protective film consists of a semiconductor substance.

18. A liquid crystal display device according to claim 11, wherein said protective film has a thickness of not less than 5 nm.

19. A liquid crystal display device according to claim 11, wherein said protective film is removed by wet etching in which a chemical having a dissolving function is made to act in a flowing manner without circulatorily using said chemical.

20. A liquid crystal display device according to claim 11, wherein said gate electrode is disposed on said insulating film formed in contact with said clean surface of said semiconductor thin film.

* * * * *